(12) United States Patent
Chen et al.

(10) Patent No.: US 10,209,546 B2
(45) Date of Patent: Feb. 19, 2019

(54) DISPLAY PANEL AND DISPLAY DEVICE, AND FABRICATION METHODS THEREOF

(71) Applicant: BOE TECHNOLOGY GROUP CO., LTD., Beijing (CN)

(72) Inventors: Liqiang Chen, Beijing (CN); Wenyue Fu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/571,163

(22) PCT Filed: Jun. 20, 2017

(86) PCT No.: PCT/CN2017/089152
§ 371 (c)(1),
(2) Date: Nov. 1, 2017

(87) PCT Pub. No.: WO2018/014689
PCT Pub. Date: Jan. 25, 2018

(65) Prior Publication Data
US 2018/0224688 A1    Aug. 9, 2018

(30) Foreign Application Priority Data
Jul. 21, 2016   (CN) .......................... 2016 1 0581227

(51) Int. Cl.
*G02F 1/1333*    (2006.01)
*H01L 51/00*    (2006.01)
(Continued)

(52) U.S. Cl.
CPC .... *G02F 1/133305* (2013.01); *G02F 1/13454* (2013.01); *H01L 51/5253* (2013.01);
(Continued)

(58) Field of Classification Search
CPC ........... G02F 1/133305; H01L 51/0097; H01L 2251/5338; H01L 51/5253
See application file for complete search history.

(56) References Cited

U.S. PATENT DOCUMENTS

| 8,796,921 B2 | 8/2014 | Nam |
| 2014/0042406 A1 | 2/2014 | Degner et al. |

(Continued)

FOREIGN PATENT DOCUMENTS

| CN | 103928398 A | 7/2014 |
| CN | 104103669 A | 10/2014 |

(Continued)

OTHER PUBLICATIONS

International Search Report & Written Opinion dated Aug. 18, 2017, regarding PCT/CN2017/089152.
(Continued)

*Primary Examiner* — Jia Pan
(74) *Attorney, Agent, or Firm* — Intellectual Valley Law, P.C.

(57) ABSTRACT

Display panel and display device, and fabrication methods are provided. The method for fabricating the display panel includes forming a protective layer at least on a bending region, the bending region being in a non-display region containing peripheral circuits of the display panel, to cover the peripheral circuits, and folding the display panel at the bending region towards a back surface of the display panel. When the display panel is folded at the bending region towards the back surface of the display panel, the protective layer coated on the bending region provides protection for the peripheral circuits formed on the surface of the bending region.

10 Claims, 7 Drawing Sheets

(51) Int. Cl.
*H01L 51/52* (2006.01)
*H01L 51/56* (2006.01)
*G02F 1/1345* (2006.01)

(52) U.S. Cl.
CPC .......... *H01L 51/56* (2013.01); *H01L 51/0097* (2013.01); *H01L 2251/5338* (2013.01)

(56) References Cited

U.S. PATENT DOCUMENTS

| | | |
|---|---|---|
| 2014/0098471 A1 | 4/2014 | Nam |
| 2014/0306941 A1* | 10/2014 | Kim .................. G06F 1/1652 345/204 |
| 2015/0021570 A1 | 1/2015 | Kim et al. |
| 2015/0200375 A1 | 7/2015 | Kim et al. |
| 2015/0380679 A1 | 12/2015 | Fujiyoshi et al. |
| 2016/0125954 A1* | 5/2016 | Gu ...................... G11C 19/28 377/64 |
| 2016/0174304 A1* | 6/2016 | Kim .................... H05B 33/04 313/511 |
| 2016/0189648 A1* | 6/2016 | Xiao .................... G09G 3/3677 345/212 |
| 2017/0250237 A1* | 8/2017 | Cheng ................ H01L 51/0097 |
| 2017/0262109 A1* | 9/2017 | Choi .................... G06F 3/0412 |
| 2017/0323779 A1* | 11/2017 | Um ................... G02F 1/133711 |
| 2017/0371194 A1* | 12/2017 | Tomioka ........... G02F 1/133305 |
| 2018/0019440 A1* | 1/2018 | Namkung ........... H01L 27/3276 |

FOREIGN PATENT DOCUMENTS

| | | |
|---|---|---|
| CN | 104300089 A | 1/2015 |
| CN | 104521331 A | 4/2015 |
| CN | 104779266 A | 7/2015 |
| CN | 105280673 A | 1/2016 |

OTHER PUBLICATIONS

First Office Action in the Chinese Patent Application No. 201610581227.9, dated May 3, 2017; English translation attached.

Second Office Action in the Chinese Patent Application No. 201610581227.9, dated Sep. 20, 2017; English translation attached.

* cited by examiner

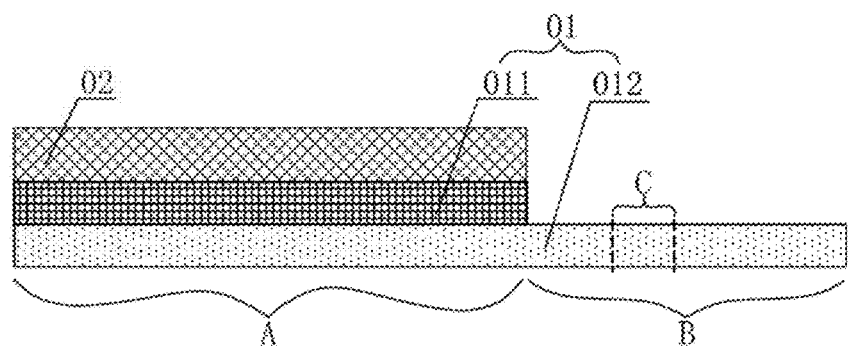
FIG. 11
Providing a substrate material layer on both the display region and the non-display region of the display panel to form a base substrate of the display panel, the substrate materil layer made of a flexible material —S401
FIG. 12
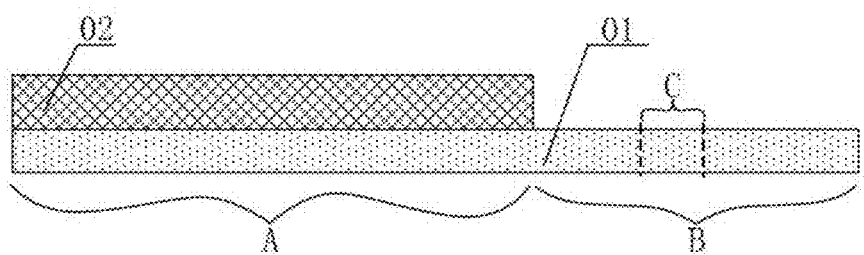
FIG. 13

DISPLAY PANEL AND DISPLAY DEVICE, AND FABRICATION METHODS THEREOF

CROSS-REFERENCE TO RELATED APPLICATION

This application is a national stage application under 35 U.S.C. § 371 of International Application No. PCT/CN2017/089152, filed Jun. 20, 2017, which claims the priority of Chinese Patent Application No. 201610581227.9, filed on Jul. 21, 2016, the content of which is incorporated by reference in its entirety.

TECHNICAL FIELD

The present disclosure generally relates to the field of display technology and, more particularly, relates to a display panel and a display device, and fabrication methods thereof.

BACKGROUND

The overall dimension and the weight of a display panel are important factors that need to be evaluated prior to applying the display panel in a display device. In order to have an electronic device with better looking and have the display area of the screen bigger, the dimension of the border of the display panel needs to be as narrow as possible. That is, a narrowed border is more required for the display panel.

Currently, the non-display region of the base substrate in a flexible display panel can be permanently folded back to the opposite side of the display screen of the display panel, and thus the size of the border region of the flexible display panel is reduced.

However, for display panels appeared in commonly-used devices, the base substrate may be thin. Usually, the thickness of the base substrate is only around 10 µm. As the non-display region of the base substrate is used to fabricate circuit structures, when the non-display region of the base substrate is folded back, the wiring of the circuit structures may be easily broken or peeled off, and thus cause undesired display effect of the display panel.

The disclosed display panel, display device, and fabrication methods are directed to at least partially alleviate one or more problems set forth above and to solve other problems in the art.

SUMMARY

The present disclosure provides an array substrate, a method for fabricating the array substrate, and a display device containing the display panel.

An aspect of the present disclosure provides a method for fabricating a curved display panel. The method for fabricating the curved display panel includes forming a protective layer at least on a bending region, the bending region being in a non-display region containing peripheral circuits of the display panel, to cover the peripheral circuits, and folding the display panel at the bending region towards a back surface of the display panel.

Further, the protective layer is made of a material including a photosensitive adhesive. After forming the protective layer at least on the bending region, the fabrication method further includes half-curing at least a portion of the protective layer corresponding to the bending region in an exposure process using a mask plate.

Optionally, the protective layer is made of a material including a photosensitive adhesive. And after forming the protective layer at least on the bending region to cover the peripheral circuits, the fabrication method further includes half-curing the protective layer in an exposure process.

Further, after folding the display panel at the bending region towards the back surface of the display panel, the fabrication method further includes performing a secondary exposure process on the protective layer to completely cure the protective layer.

Further, prior to forming the protective layer at least on the bending region, the fabrication method further includes providing a first substrate at least on a display region of the display panel, providing a second substrate on the non-display region, and forming a base substrate of the display panel by joining the first substrate and the second substrate. The second substrate is made of a flexible material.

Optionally, prior to forming the protective layer at least on the bending region, the fabrication method further includes providing a first substrate and a second substrate. The second substrate is provided on the non-display region and a display region of the display panel, and a first substrate is attached onto a top surface of the second substrate and above the display region. The first substrate and the second substrate together form a base substrate of the display panel. The second substrate is made of a flexible material.

Optionally, prior to forming the protective layer at least on the bending region, the fabrication method further includes providing a substrate material layer on both a display region and the non-display region to form a base substrate of the display panel. The substrate material layer is made of a flexible material.

Further, forming the non-display region containing the peripheral circuits includes simultaneously forming a plurality of gate lines and a plurality of data lines in a display region of the base substrate and a plurality of signal leads or driving circuits in the non-display region of the base substrate, and then bonding a plurality of driving chips on the base substrate in the non-display region and connected to the signal leads. The plurality of gate lines and the plurality of data lines are vertically and horizontally crossed in the display region. The signal leads include a plurality of first signal leads connecting with the gate lines and/or a plurality of second lines connecting with the data lines.

Further, forming the protective layer at least on the bending region defined includes coating a protective layer on the surface of the driving circuits that is other than the driving chips.

Optionally, forming the non-display region containing the peripheral circuits includes forming a plurality of gate lines and a plurality of data lines in the display region of the base substrate, and a plurality of signal leads and a plurality of multi-level cascaded shift register units in the non-display region of the base substrate. The plurality of gate lines and the plurality of data lines are vertically and horizontally crossed in the display region. The plurality of signal leads are connected to the multi-level cascaded shift register units. The signal leads include a plurality of first signal leads connecting with the gate lines and/or a plurality of second lines connecting with the data lines.

Optionally, the multi-level cascaded shift register units form a plurality of gate driver on array (GOA) circuits.

Optionally, when bending the display panel at the bending region towards the back surface of the display panel, the bending angle is larger than or equal to 90°.

Optionally, prior to folding the display panel at the bending region towards the back surface of display panel, the fabrication method also includes attaching a back film on the back surface of the display panel.

Another aspect of the present disclosure provides a display panel. The display panel includes a display region, a non-display region, and a protective layer. A bending region is defined in a non-display region containing peripheral circuits. The protective layer is formed at least on the bending region to cover the peripheral circuits. Moreover, the display panel is bent at the bending region towards a back surface of the display panel.

Further, the protective layer is made of a material including a photosensitive adhesive.

Optionally, a first substrate is provided at least on the display region, and a second substrate is provided on the non-display region. The second substrate is made of a flexible material.

Optionally, the display panel further includes a first substrate and a second substrate. The second substrate is provided on the non-display region and the display region, and a first substrate is attached onto a top surface of the second substrate and above the display region. The first substrate and the second substrate together form a base substrate of the display panel. The second substrate is made of a flexible material.

Optionally, the display panel is at the bending region having a bending angle larger than or equal to 90°.

Optionally, the display panel also includes a back film attached on the back surface of the display panel.

Another aspect of the present disclosure provides a display device. The display device contains the display panel.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIG. 11 illustrates a schematic view of a base substrate according to the method illustrated in FIG. 10;

FIG. 12 illustrates a flow chart of a third method for fabricating a base substrate according to various disclosed embodiments;

FIG. 13 illustrates a schematic view of a base substrate according to the method illustrated in FIG. 12;

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Figure 1:
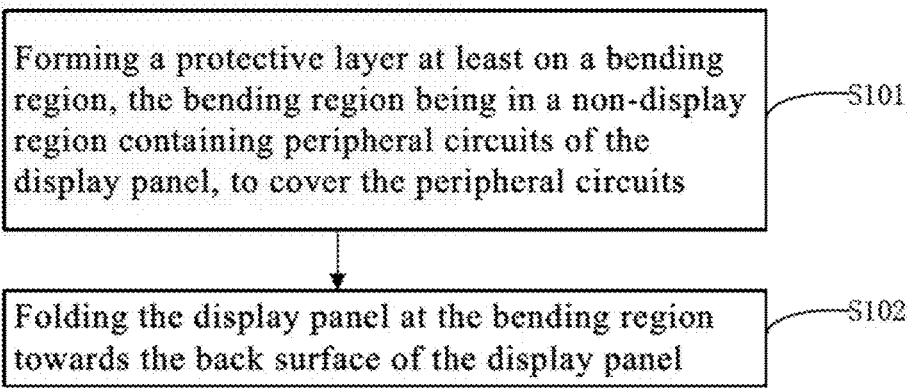
FIG. 1 illustrates a flow chart of an exemplary method for fabricating a display panel according to various disclosed embodiments.

The present disclosure provides a method for fabricating a display panel. FIG. 1 illustrates a flow chart of an exemplary method for fabricating a display panel according to various disclosed embodiments.

Figure 2:
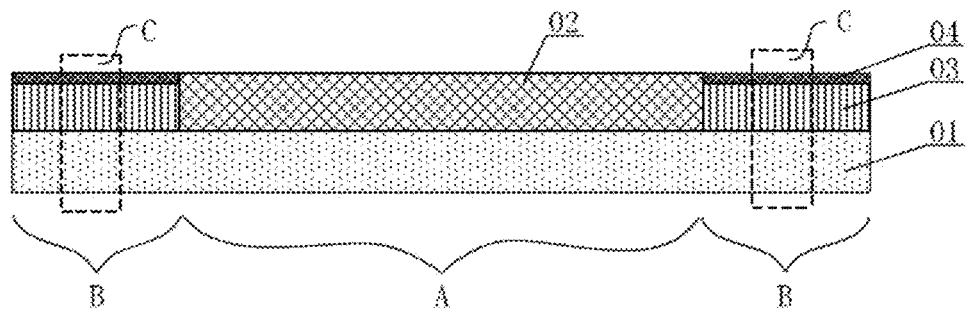
FIG. 2 illustrates a schematic diagram of a scheme to form a protective layer on a display panel according to various disclosed embodiments.

Referring to FIG. 1, a bending region may be defined in a non-display region containing a plurality of peripheral circuits, and a protective layer may then be formed at least on the bending region to cover the peripheral circuits (e.g., in S101). FIG. 2 illustrates a schematic diagram of a scheme to form a protective layer on a display panel according to various disclosed embodiments.

Referring to FIG. 2, a display panel may be provided. The display panel may include a display region A and a non-display region B surrounding the display region A. Further, a plurality of peripheral circuits 03 may be formed in the non-display region B. A bending region C may be defined in the non-display region B. Moreover, a protective layer 04 may be formed on the bending region C to cover the plurality of peripheral circuits 03.

To realize the display function of the display panel, the display panel may also include a base substrate 01 and a display device layer 02 formed on the base substrate 01 in the display region A. The display component layer 02 may be an organic light emitting diode (OLED) device layer, liquid crystal display (LCD) device layer, or any other appropriate layer containing display devices.

In one embodiment, the display device layer 02 is an OLED device layer. The OLED device layer may further include an array substrate and a pixel definition layer formed on the array substrate. A pixel definition region of the pixel definition layer may sequentially include an anode, a hole-injection layer, a hole-transport layer, a light-emitting layer, an electron-transport layer, an electron-injection layer, and a cathode.

In another embodiment, the display device layer is a LCD device layer. The LCD device layer may further include an array substrate, a color film substrate as a counter substrate of the array substrate, and a liquid crystal layer between the array substrate the color film substrate.

Figure 9:
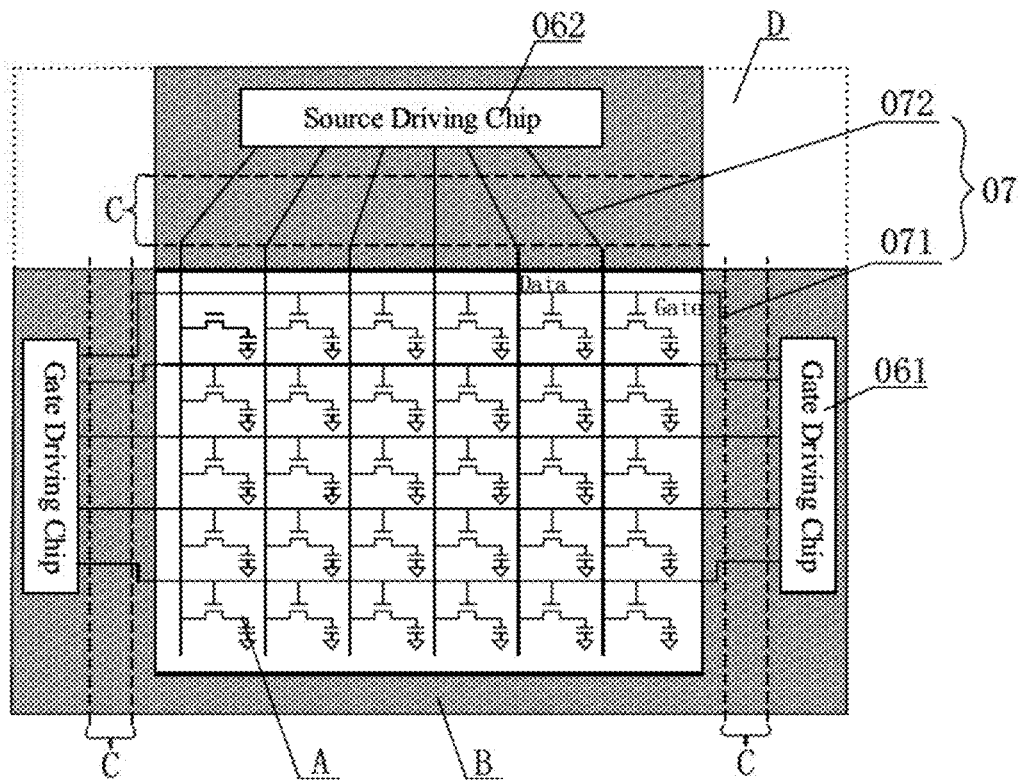
FIG. 9 illustrates a schematic diagram of a scheme to arrange peripheral circuits on a display panel according to various disclosed embodiments.

FIG. 9 illustrates a schematic diagram of a scheme to arrange peripheral circuits on a display panel according to various disclosed embodiments. Referring to FIG. 9, the peripheral circuits 03 may include a plurality of driving chips 06 and a plurality of signal leads 07 connecting the plurality of driving chips 06 to the display device layer 02.

Moreover, the peripheral circuits 03 may bond the driving chips 06 to the non-display region B and connect the driving chips 06 to a plurality of signal leads 07 in the display device layer 02 of the display region A to realize the display function.

The driving chips 06 may include a plurality of gate driving chips 061 used to send out scanning signals to the gate lines. The driving chips 06 may also include a plurality of source driving chips 062 to send out display signals to the data lines. The driving chips 06 described above may be bonded on the base substrate 01 of the non-display region B through a banding process.

Alternatively, the peripheral circuits may include a plurality of gate driver on array (GOA) circuits. Specifically, the plurality of GOA circuits may be integrated in the non-display region.

The GOA circuits integrated in the non-display region may be able to perform line-by-line scan for the gate lines in the display region. Therefore, as compared to the gate driving chips which require to be installed on the base substrate of the non-display region through a banding process, the GOA circuits do not require any banding process. In addition, the area occupied by GOA circuits is also small. Therefore, integrating the GOA circuits in the non-display region may be conducive to simplifying fabrication process and reducing the border of the display device.

Therefore, during the formation of the display device layer on the base substrate, the GOA circuits may be simultaneously fabricated in the non-display region to surround the display device layer.

Figure 3:
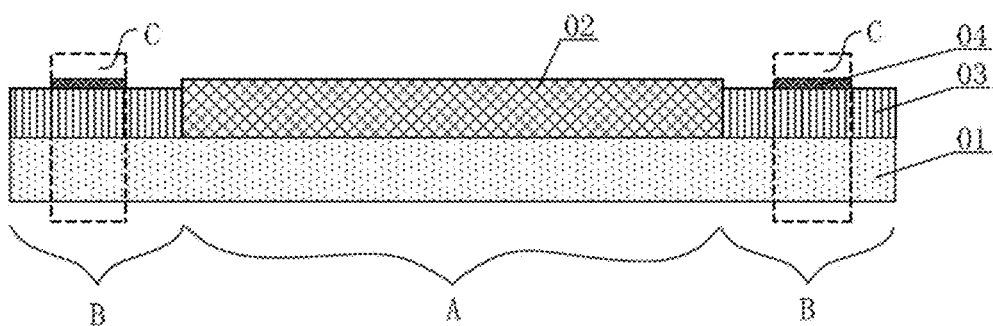
FIG. 3 illustrates a schematic diagram of another scheme to form a protective layer on a display panel according to various disclosed embodiments.

Further, the protective layer 04 may be coated on a region including at least the bending region C to ensure sufficient protection for the peripheral circuits 03 in the subsequent folding process. Moreover, forming the protective layer 04 on at least the bending region C to cover the peripheral circuits 03 may include a scheme as shown in FIG. 2, where the protective layer 04 is formed on the entire non-display region B to cover the peripheral circuits 03. FIG. 3 shows a schematic diagram of another scheme to form the protective layer on the non-display region according to various disclosed embodiments. Referring to FIG. 3, the protective layer 04 is formed only on the bending region C to cover the portion of the peripheral circuits 03 formed in the bending region C.

Figure 4:
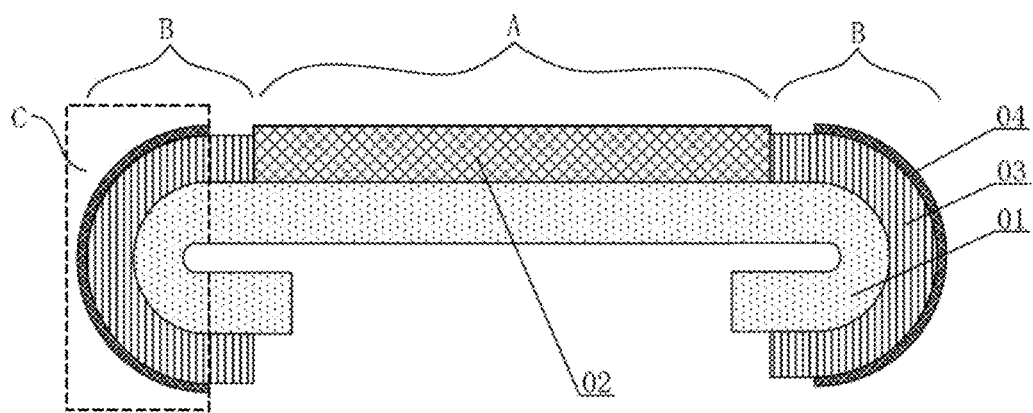
FIG. 4 illustrates a schematic view of an exemplary display panel with a folded non-display region according to various disclosed embodiments.

Returning to FIG. 1, after forming the protective layer, the display panel may be folded towards the back surface of the display panel at the bending region (e.g., in S102). FIG. 4 illustrates a schematic view of an exemplary display panel with a folded non-display region according to various disclosed embodiments.

Referring to FIG. 4, the display panel may be folded at the bending region C towards the back surface of the display panel. Moreover, the back surface of the display panel refers to the surface of the base substrate 01 opposite to the surface on which the display device layer 02 is formed.

When folding the display panel, the portion of the display panel at each edge away from the display region A may be bent at the bending region C towards the back surface of the base substrate 01. The bending angle may be any appropriate angle. Specifically, as long as the bending angle is greater than or equal to 90° such that the border of the display panel is reduced after folding, the bending angle may be regarded as an appropriate angle. For example, referring to FIG. 4, the folding angle may be 180° such that after folding, the portion of the display panel at each edge may be folded onto the back surface of the base substrate 01 or may be parallel to the back surface of the base substrate 01. In other embodiments, the width of the folded portion of the display panel away from the display region A may be small, and accordingly, the portion of the display panel at each edge may only be folded by 90° towards the back surface of the base substrate 01. As such, the folded portion of the display panel may be perpendicular to the base substrate 01 after folding.

Further, referring to FIG. 9, a plurality of source driving chips 062 may be bonded on the base substrate 01 in the upper area of the non-display region B and a plurality of gate driving chips 061 may be bonded on the base substrate 01 in the two side areas of the non-display region B. Alternatively, a plurality of GOA circuits may be integrated on the base substrate 01 in the two side areas of the non-display region B. The bending region C may then be defined in the upper area and also in each side area of the non-display region B of the base substrate 01. Further, the upper area of the non-display region of the base substrate 01 may be folded at the portion of the bending region C defined in the upper area of the non-display region to reduce the upper border of the display panel. Similarly, each side area of the non-display region of the base substrate 01 may be folded at the portion of the bending region C defined in the side area of the non-display region to reduce the corresponding side border of the display panel.

Moreover, the use of terms such as "upper" and "side" in the above descriptions is merely to indicate the positions of the entities relative to the display panel as shown in the figures, and thus does not necessarily limit the claim scope to a specific embodiment. In other embodiments, the positions of the entities relative to the display panel may be changed according to the position of the display panel.

According to the disclosed fabrication method for a display panel, a bending region is defined in the non-display region containing a plurality of peripheral circuits, a protective layer is then formed on at least the bending region to cover the portion of the peripheral circuits in the bending region, and the display panel is folded at the bending region towards the back surface of the display panel. As such, when folding the display panel at the bending region towards the back surface of the display panel, the protective layer formed in the bending region may become the first part of the display panel to be affected by the stress induced by bending, and the peripheral circuits may then be affected as the display panel is further bent. Further, the protective layer may be the first part of the display panel to be affected by the stress and may cancel a portion of the stress induced by bending, the stress applied on the peripheral region during bending may then be reduced. Therefore, the protective layer may provide protection for the peripheral circuits, which may prevent the peripheral circuits from breaking due to tensile stress during bending and the lines from peeling off the base substrate in the bending region, and thus avoid further causing undesired display effect or affecting the reliability of the display panel.

Further, the protective layer 04 may be formed by a material including a photosensitive adhesive because the hardness degree of the photosensitive adhesive may be adjusted by the dose of the light exposure based on actual needs. In one embodiment, the protective layer 04 is formed by a photosensitive adhesive. The exposure process performed on the protective layer 04 is described as following.

After forming the protective layer 04 on at least the bending region C to cover the peripheral circuits 03 (e.g., in S101), the fabrication method may include half-curing the protective layer 04 through an exposure process.

According to the disclosed fabrication method, the protective layer 104 may be formed by a material including a photosensitive adhesive. Photosensitive adhesive is a colloidal material including two types: positive adhesive and negative adhesive. The initial state of a positive adhesive is a colloidal state, and after being irradiated by ultra-violet (UV) light, the positive adhesive may be quickly cured and become solid. On the contrary, the initial state of a negative adhesive is a solid, and after being irradiated by UV light, the irradiated portion of the negative adhesive may be quickly softened and become colloidal. For illustration purpose, a positive photosensitive adhesive is used as an example in the present disclosure to illustrate the disclosed fabrication process. In other embodiments, the type of the photosensitive adhesive may be selected based on the actual needs. That is, the photosensitive adhesive may also be a negative adhesive. In addition, when the protective layer is made of a negative adhesive, the principle is the same as a case where a positive adhesive is used to form the protective layer. Specifically, the irradiation time and other parameters may be adjusted to achieve the same effect.

As such, during the exposure of the protective layer 04, the exposure may be stopped when the protective layer 04 becomes half-cured by controlling the irradiation time and/or the intensity of the UV light. The half-cured protective layer 04 may be in a soft colloidal state with enhanced hardness. Therefore, when performing the exemplary Step S102, i.e. folding the display panel at the bending region C towards the back surface of the display panel, because the protective layer 04 may still be soft and colloidal, the bending region C may be more easily bent. In addition, the hardness of the half-cured protective layer 04 is enhanced after exposure, and thus the colloid in the protective layer 04 may not be too soft, which prevents forming a non-uniform thickness for the protective layer 04 and dripping of the colloid due to highly flowable protective layer 04.

In another embodiment, after performing the exemplary Step S101, the exposure process of the fabrication method may also be performed through another method described as following.

Figure 6:
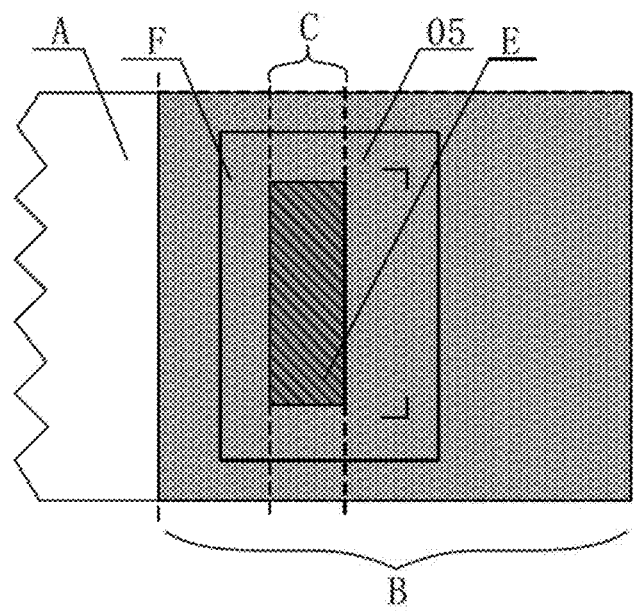
FIG. 6 illustrates a schematic diagram of performing an exposure process on a protective layer using a mask plate according to various disclosed embodiments.

FIG. 6 illustrates a schematic diagram of performing an exposure process on a protective layer using a mask plate. Referring to FIG. 6, a mask plate 05 may be used in the half-curing process to expose the protective layer 04 formed in the bending region C. As such, the portion of the protective layer 04 corresponding to the position of a first region E of the mask plate 05 may become half-cured while the portion of the protective layer 04 corresponding to the position of a second region F of the mask plate 05 may be completely cured. Specifically, the first region may correspond to the bending region C. Further, because the photosensitive adhesive used to form the protective layer 04 is positive, the transmission rate in the first region E may be smaller than the transmission rate in the second region F, and thus the intensity of irradiation in the second region F may be large while the intensity of irradiation in the first region E may be small.

Figure 5A:
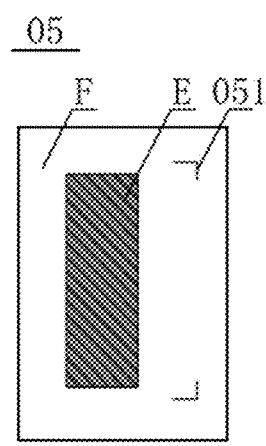
FIG. 5a illustrates a schematic view of a mask plate according to various disclosed embodiments.
Figure 5B:
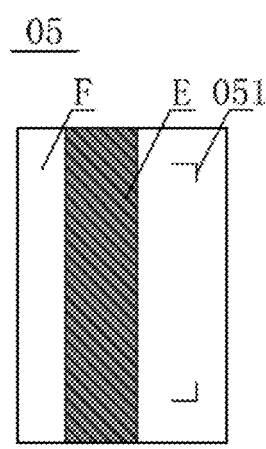
FIG. 5b illustrates a schematic view of another mask plate according to various disclosed embodiments.

FIG. 5a and FIG. 5b each shows an example of the mask plate used in the process to expose the protective layer.

Referring to FIG. 5a and FIG. 5b, each mask plate may include a first region E and a second region F surrounding the first region E.

Referring to FIG. 6, the portion of the protective layer 04 formed on the peripheral circuits 03 in the non-display region B may be exposed using the mask plate 05 as a mask. Specifically, UV light may be completely transmitted through the second region F so that the portion of the protective layer 04 coved by the second region F of the mask plate 05 may be completely cured. In the meantime, because a portion of the UV light may be shaded by the first region E of the mask plate 05, only a portion of the UV light may be transmitted through the first region E and irradiate the portion of the protective layer 04 covered by the first region E of the mask plate 05. Therefore, during the same exposure time as for the second region F, the portion of the protective layer 04 covered by the first region E of the mask plate 05 may be half-cured.

The mask plate 05 may be made of a fully transparent material, such as quartz. A shading layer may be formed in the second region F of the mask plate 05 to shade the light and thus reduce the transmission rate of the light. As such, during the exposure process using the mask plate 05, light may be completely transmitted through the entire region of the mask plate 05 other than the second region F. Therefore, the entire region of the mask plate 05 other than the second region F may be the first region E.

Further, the area covered by the first region E of the mask plate 05 may have any appropriate size as long as the first region E is able to completely cover the bending region C. As such, by exposing the protective layer 04 using the mask plate 05, the portion of the protective layer 04 formed in the bending region C is able to be half-cured.

The shading layer in the first region E may be formed by using a pasting method any other appropriate method to attach a metal film with UV cutoff properties on the first region E. The metal film may be made of Al, Cu, etc. Optionally, the metal film may be an aluminum film. By arranging a first region E with a shading pattern on the mask plate 05, the UV transmission rate in a region covered by the first region E of the mask plate 05 may be reduced to be lower than 50% of the transmission rate in a region covered by the second region F. Therefore, during the process using the mask plate 05 to expose the protective layer 04, when the portion of the protective layer 04 covered by the second region F is completely cured, the portion of the protective layer 04 covered by the first region E may be half-cured with soft colloidal texture. At the moment, the exposure process may be stopped.

Moreover, in addition to the method that uses a mask plate to shade the UV light, other methods, such as controlling the thickness of the protective layer, controlling the irradiation time and/or light intensity, etc. may also be able to bond a stress-neutral layer, which demonstrates zero internal tangential stress when the material is deformed by bending, onto the bending region. As such, the influence of material bending deformation on the lines distributed on the material may be minimized, and thus line breaking may be avoided.

Further, referring to FIG. 6, when the protective layer 04 is exposed by using the mask plate 05 to shade the UV light, because the first region E of the mask plate 05 may correspond to the bending region C, that is, the first region E may cover the bending region C, the portion of the protective layer 04 formed in the bending region C may be half-cured. Further, when the display panel is folded at the bending region C towards the back surface of the display panel, the bending region C may also be easily bent. In addition, because the portion of the protective layer 04 formed in the non-display region B around the bending region C may be completely cured with a hard texture after exposure, the portion of the peripheral circuits 03 formed in the non-display region B around the bending region C may not be easily displaced during the folding process, and thus prevent the lines from peeling off or warping up from the base substrate 01 due to the pulling force between the lines during the bending process. Therefore, using the mask plate 05 to expose the protective layer 04 may provide improved protection for the bending region C during the bending process.

Further, referring to FIG. 5*a* and FIG. 5*b*, at least one pair of alignment markers 051 may be formed on the mask plate 05. Accordingly, markers may also be made at the corresponding positions in the bending region C of the base substrate 01. As such, when batch operation of the disclosed methods is performed on a number of display panels, by aligning the markers 051 on the mask plate 05 with the markers on each base substrate 01, an exclusive bending position may be defined, which ensures that the position of bending region C on each display panel may be identical during a repeated operation process. Therefore, the accuracy and the reproducibility of the bending position may be improved.

Further, after performing exemplary Step S102, the fabrication process may also include performing a secondary exposure process to fully cure the protective layer 04. As such, the fully-cured protective layer 04 may be able to permanently keep the bending state of the display panel after the bending process, and thus prevent changes in the position or the state of the bending region C during operation or transport.

When the display panel is folded at the bending region C, in order to make the display panel easily bent, the portion of the base substrate 01 of the display panel corresponding to at least the display panel may be made of a flexible material. In the following, examples will be provided to illustrate the fabrication of the base substrate 01 in a method for fabricating a display panel according to various disclosed embodiments.

Figure 7:
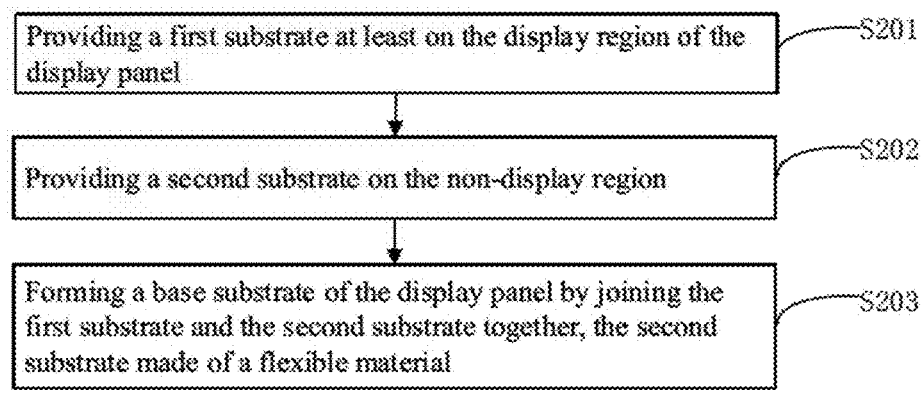
FIG. 7 illustrates a flow chart of a method for fabricating a base substrate according to various disclosed embodiments.
Figure 8A:
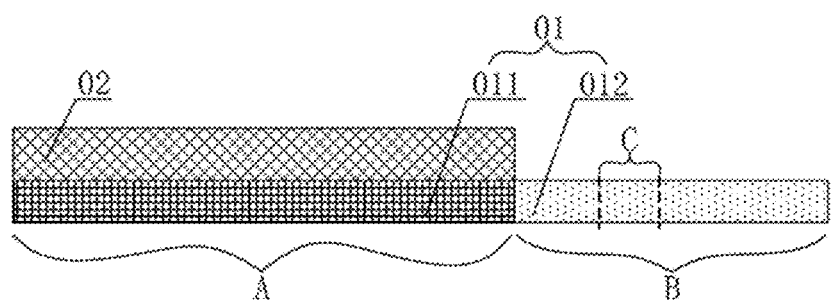
FIG. 8a illustrates a schematic view of a base substrate according to the method illustrated in FIG. 7.

As an example, FIG. 7 illustrates a flow chart of a method for fabricating a base substrate according to various disclosed embodiments. FIG. 8*a* illustrates a schematic view of a corresponding base substrate. Referring to FIG. 7, prior to defining a bending region C in the non-display region B including a plurality of peripheral circuits 03 (e.g., in S101), the fabrication method may further include the following steps.

In S201: Providing a first substrate 011 at least on the display region A of the display panel.

In S202: Providing a second substrate 012 on the non-display region B.

In S203: Forming a base substrate 01 of the display panel by joining the first substrate 011 and the second substrate 012. The second substrate 012 may be made of a flexible material.

As such, referring to FIG. 8*a*, the base substrate 01 may be formed by joining the first substrate 011 and the second substrate 012 together. Further, the second substrate 012 corresponding to the non-display region B may be made of a flexible material such that the goal to have at least the second substrate 012 flexible may be achieved.

Figure 8B:
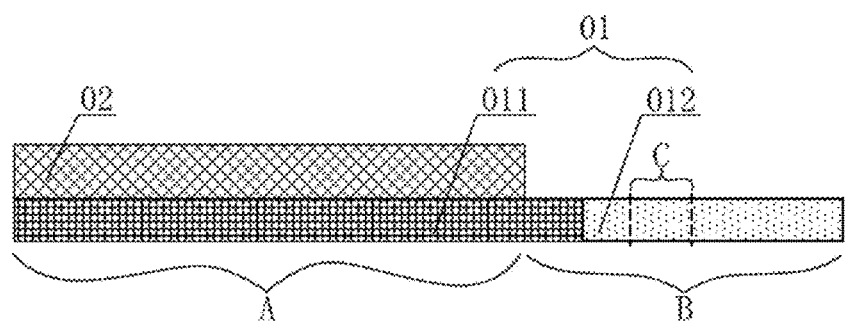
FIG. 8b illustrates a schematic view of another base substrate according to the method illustrated in FIG. 7.

Moreover, providing the first substrate 011 at least on the display region A may refer to one of the following situations. Referring to FIG. 8*a*, the first substrate 011 may be arranged on the display region A, the second substrate 012 may be arranged on the non-display region B, and the first substrate 011 and the second substrate 012 may then be joined together to form the base substrate 01. Therefore, the joint edge between the first substrate 011 and the second substrate 012 may be the boundary between the display region A and the non-display region B. Alternatively, FIG. 8*b* illustrates a schematic view of another base substrate according to various disclosed embodiments. Referring to FIG. 8*b*, a second substrate 012 may be arranged on the non-display region B and a first substrate 011 may be arranged on the display region A. Moreover, a portion of the first substrate 011 extends into the non-display region B. In the non-display region B, the first substrate 011 may not overlap with the bending region C. The first substrate 011 and the second substrate 012 may then be joined together to form the base substrate 01. Therefore, the joint edge between the first substrate 011 and the second substrate 012 may be in the non-display region B.

Further, the first substrate 011 may be made of any appropriate material. That is, the first substrate 011 may or may not be made of a flexible material. In one embodiment, the flexible material may be polyimide or any other appropriate flexible material with similar properties.

Moreover, the peripheral circuits 03 formed in the non-display region B of the base substrate 01 may be source driving chips 062 and gate driving chips 061 installed in the non-display region B through a banding process, or GOA circuits integrated in the non-display region B. In the following, examples will be provided to illustrate the two schemes for arranging the peripheral circuits.

In one embodiment, referring to FIG. 9, forming the peripheral circuits 03 in the non-display region B may include forming a plurality of gate lines and a plurality of data lines in the display region A of the base substrate 01 and simultaneously forming a plurality of signal leads 07 in the non-display region B of the base substrate 01, and then bonding a plurality of driving chips 06 on the base substrate 01 in the non-display region B and connected to the signal leads 07.

The plurality of gate lines and the plurality of data lines may be vertically and horizontally crossed in the display region A. The signal leads 07 may include a plurality of first signal leads 071 connecting with the gate lines and/or a plurality of second lines 072 connecting with the data lines. Further, the first signal leads 071 may be made of a same material and in a same layer with the gate lines or the data lines; and the second signal leads 072 may also be made of a same material and in a same layer with the gate lines or the data lines.

Moreover, after forming the plurality of first signal leads 071 and the second signal leads 072, the first signal leads 071 may be separately connected to the corresponding pins of the gate driving chips 061 to form gate driving circuits, and the second signal leads 072 may be separately connected to the corresponding pins of the source driving chips 062 to form source driving circuits. The peripheral circuits may include both gate driving circuits and source driving circuits.

In one embodiment, after each side area of the non-display region B is folded, the upper area of the non-display region B may then be folded. Because in the joint region between each side area of the non-display region B and the upper area of the non-display region B, the thickness may have been increased after folding the two side areas of the non-display region B, further folding in the joint region may be difficult. Therefore, in a case that folding both the upper area and the two side areas of the non-display region B is required, it may need to be ensured that folding the non-display region B on each side (i.e. left, top, or right side) is not affected by folding on a neighboring side. As shown in FIG. 9, to ensure that folding the upper area of the non-display region B is not affected by the folded two side areas of the non-display region B, the joint area between the upper area and each side area of the non-display region B may be cut along the edges of a cut region D. As such, the upper area of the non-display region B of the base substrate 01 may be separated from each side area of the non-display region B of the base substrate 01.

Further, a protective layer 04 may be coated on the surface of the driving circuits that is other than the driving chips 06 such that the coated protective layer 04 may not affect the heat dispersion at the surfaces of the driving chips 06. Moreover, the defined bending region C usually does not include the positions corresponding to the driving chips 06. Therefore, without coating the protective layer 04 on the driving chips 06, the protection for the bending region C provided by the protective layer 04 may not be affected during the folding process.

Figure 14:
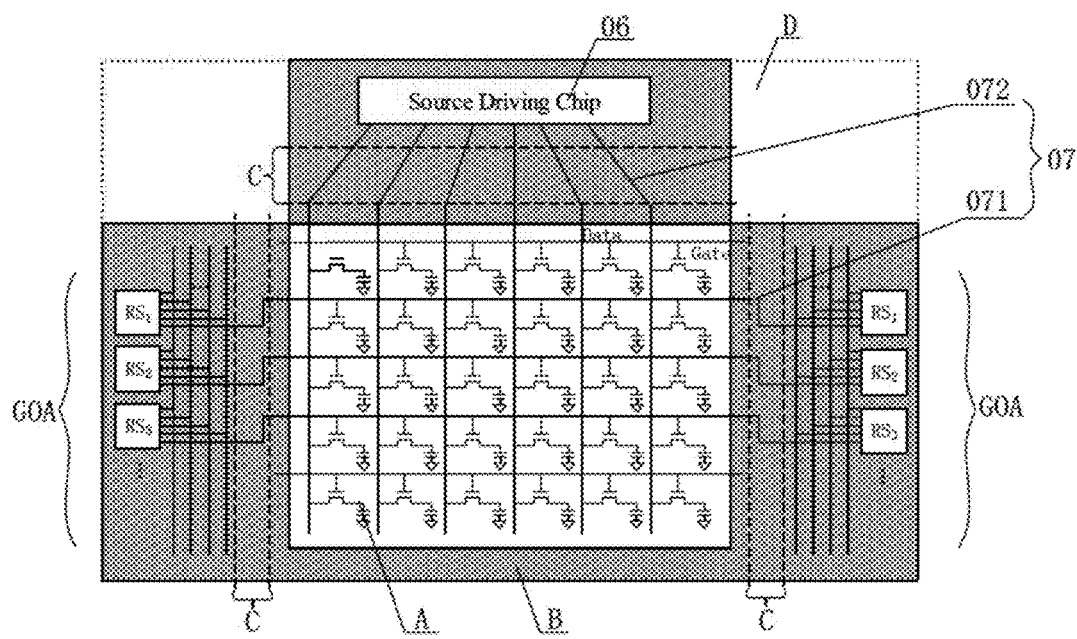
FIG. 14 illustrates a schematic diagram of another scheme to arrange peripheral circuits on a display panel according to various disclosed embodiments.

FIG. 14 illustrates a schematic diagram of another scheme to arrange peripheral circuits on a display panel according to various disclosed embodiments. Referring to FIG. 14, forming the peripheral circuits 03 in the non-display region B may include forming a plurality of gate lines and a plurality of data lines in the display region A of the base substrate 01, and simultaneously forming a plurality of signal leads 07 and a plurality of multi-level cascaded shift register units 08 in the non-display region B of the base substrate 01. Moreover, the plurality of signal leads 07 may be connected to corresponding multi-level cascaded shift register units 08.

The plurality of gate lines and the plurality of data lines may be vertically and horizontally crossed in the display region A. The signal leads 07 may include a plurality of first signal leads 071 connecting with the gate lines and/or a plurality of second lines 072 connecting with the data lines. The multi-level cascaded shift register units 08 may form a plurality of GOA circuits.

Further, as shown in FIG. 14, the GOA circuits may be formed on both side areas of the non-display region B surrounding the display region A. When the GOA circuits are formed on both side areas of the non-display region B, the structure of the lines may be symmetrical. In other embodiments, the GOA circuits may be formed on one side area of the non-display region B, or on any appropriate portion of the non-display region B.

Figure 10:
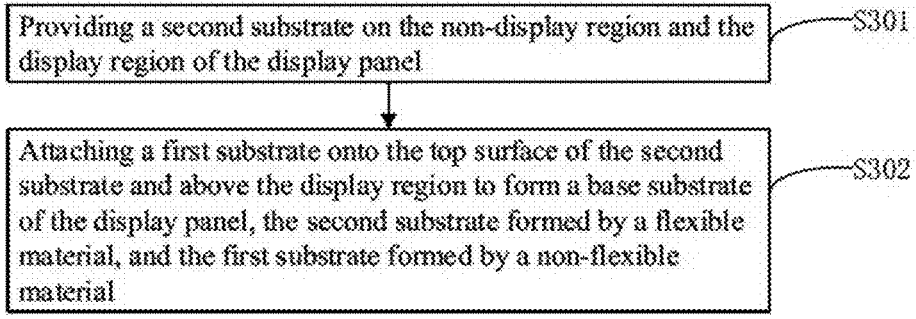
FIG. 10 illustrates a flow chart of another method for fabricating a base substrate according to various disclosed embodiments.

FIG. 10 illustrates a flow chart of another method for fabricating a base substrate according to various disclosed embodiments. FIG. 11 illustrates a schematic view of a corresponding base substrate. Referring to FIG. 10, prior to defining a bending region C in the non-display region B including a plurality of peripheral circuits 03 (e.g., in S101), the fabrication method may further include the following steps.

In S301: Providing a second substrate 012 on both the non-display region B and the display region A of the display panel. The second substrate 012 may be made of a flexible material.

In S302: Attaching a first substrate 011 onto the top surface of the second substrate 012 and above the display region A, together forming the base substrate 01 of the display panel.

As such, the base substrate 01 may include the second substrate 012 and the first substrate 011 which is attached on the top surface of the second substrate above the display region A. The first substrate 011 may be directly pasted on the top surface of the second substrate 012. The first substrate 011 may also be attached on the top surface of the second substrate 012 through any other appropriate method. The second substrate 012 may be made of a flexible material. That is, in the non-display region B, the disclosed display panel may be made of a flexible material. In the display region A, the display devices may be formed by an inflexible material, and thus the display devices in the display region A may not be bendable.

Further, the detailed arrangement and formation of the peripheral circuits 03 may refer to the corresponding illustration provided above.

FIG. 12 illustrates a flow chart of a third method for fabricating a base substrate according to various disclosed embodiments. FIG. 13 illustrates a schematic view of a corresponding base substrate. Referring to FIG. 12, prior to defining a bending region C in the non-display region B including a plurality of peripheral circuits 03 (e.g., in S101), the fabrication method may further include the following step.

In S401: Providing a substrate material layer on both the display region A and the non-display region B to form the base substrate 01 of the display panel. The substrate material layer may be made of a flexible material.

As such, the base substrate 01 may be formed by the base structural layer. The base substrate 01 may further include a display region A and a non-display region B. A display device layer 02 may then be formed in the display region A. The substrate material layer may be made of a flexible material. Therefore, the entire display panel may be a flexible panel.

Further, the detailed arrangement and formation of the peripheral circuits 03 may refer to the corresponding illustration provided above.

Figure 15:
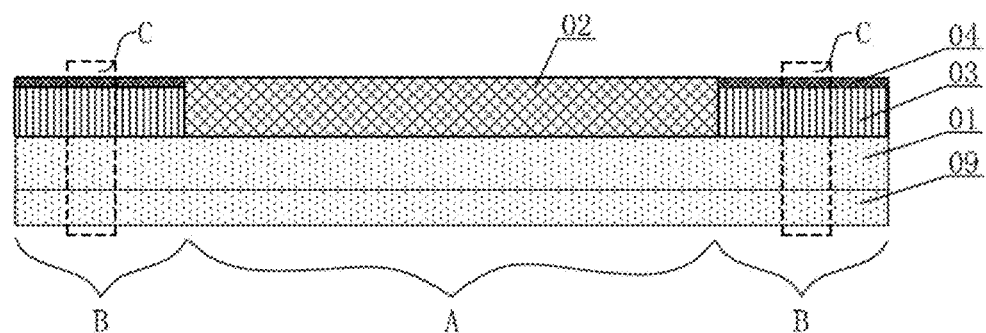
FIG. 15 illustrates a schematic view of an exemplary display panel with a backing film according to various disclosed embodiments.

Based on the structures described above, the fabrication method may further including arranging a back film on the back surface of the base substrate 01 prior to the bending process. FIG. 15 illustrates a schematic view of a display panel with a backing film attached on the back surface of the base substrate.

Therefore, because the thickness of the base substrate 01 of a display panel may be only about 10 μm, attaching the back film 09 onto the back surface of the base substrate 01 may provide protection for the base substrate 01.

The above step to attach a back film 09 to the base substrate 01 may need to be performed before bending. However, attaching the back film 09 to the back surface of the base substrate 01 may be performed before or after performing exemplary Steps S201-S203, the exemplary Steps S301-S301, or Step 401 depending on actual needs.

Moreover, the back film 09 may also be made of a flexible material such that the portion of the back film 09 in the bending region C may be able to bend together with the portion of the base substrate 01 in the bending region C during the folding process.

Further, to reduce light reflection and improve the comfort level when users view the contents displayed on the screen of the display panel, a negative reflection film may be arranged on the light-out side of the display device layer 02 of the display panel. Generally, a circular polarizer may be arranged on the light-out side of the display layer 02 as the negative reflection film.

Further, the disclosed display panel may be included in an electronic device such as cellphone, tablet computer, and other appropriate mobile devices. In such a case, to allow users to conveniently operate the electronic device through the display panel, a touch sensor layer may be arranged on the negative reflection film.

By arranging the touch sensor layer in the display panel, users may directly use the display panel to make relevant operations. Thus carrying an external keyboard may be avoided. The touch sensor layer may be bonded to the display panel through any appropriate method. Optionally, the touch sensor layer may be attached onto the negative reflection film using an optical adhesive to ensure the operation sensitivity of the touch sensor layer.

The present disclosure also provides a display panel. The display panel may be fabricated by the methods disclosed above. The improved aspects demonstrated by the disclosed display panel have been illustrated in the above description of the disclosed fabrication methods. The details of the improvements of the disclosed display panel may refer to the corresponding contents in the detailed description of the disclosed fabrication methods.

The present disclosure also provides a display device. The display device may include a display panel according to the present disclosure. The display device may inherit the improvements demonstrated by the display panel. The details of the improvements of the disclosed display device may refer to the corresponding contents in the detailed description of the disclosed methods for fabricating the display panel included in the display device.

According to the disclosed display panel, a display device, and fabrication methods, a bending region may be defined in the non-display region that includes a plurality of peripheral circuits. A protective layer may then be formed at least on the bending region to cover the peripheral circuits. Further, the display panel may be folded at the bending region towards the back surface of the display panel. When the display panel is folded at the bending region towards the back surface of the display panel, the protective layer coated on the bending region may provide protection for the peripheral circuits formed on the surface of the bending region, which prevents the peripheral circuits from breaking due to tensile stress during bending and the lines from peeling off the base substrate in the bending region, and thus avoids further causing undesired display effect or affecting the reliability of the display panel.

The foregoing description of the embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the disclosure and its best mode practical application, thereby to enable persons skilled in the art to understand the disclosure for various embodiments and with various modifications as are suited to the particular use or implementation contemplated.

It is intended that the scope of the disclosure be defined by the claims appended hereto and their equivalents in which all terms are meant in their broadest reasonable sense unless otherwise indicated. Therefore, the term "the disclosure", "the present disclosure" or the like does not necessarily limit the claim scope to a specific embodiment, and the reference to exemplary embodiments of the disclosure does not imply a limitation on the disclosure, and no such limitation is to be inferred. The disclosure is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the disclosure.

It should be appreciated that variations may be made in the embodiments described by persons skilled in the art without departing from the scope of the present disclosure as defined by the following claims. Moreover, no element and component in the present disclosure is intended to be dedicated to the public regardless of whether the element or component is explicitly recited in the following claims.

What is claimed is:

1. A method for fabricating a curved display panel, comprising:
   forming a protective layer at least on a bending region, the bending region being in a non-display region containing peripheral circuits of a display panel, to cover the peripheral circuits; and
   folding the display panel at the bending region towards a back surface of the display panel;
   wherein the protective layer is made of a material including a photosensitive adhesive;
   after forming the protective layer at least on the bending region, the method further includes half-curing at least a portion of the protective layer corresponding to the bending region in an exposure process using a mask plate; and
   after folding the display panel at the bending region towards a back surface of the display panel, the method further includes performing a secondary exposure process on the protective layer to completely cure the protective layer.

2. The method of claim 1, prior to forming the protective layer at least on the bending region, further including:
   providing a first substrate at least on a display region of the display panel;
   providing a second substrate on the non-display region; and
   forming a base substrate of the display panel by joining the first substrate and the second substrate, wherein the second substrate is made of a flexible material.

3. The method of claim 1, prior to forming the protective layer at least on the bending region, further including:
   providing a first substrate and a second substrate, wherein:
   the second substrate is provided on the non-display region and a display region of the display panel; and
   the first substrate is attached onto a top surface of the second substrate and above the display region, together forming a base substrate of the display panel, wherein the second substrate is made of a flexible material.

4. The method of claim 1, prior to forming the protective layer at least on the bending region, further including:
   providing a substrate material layer on both a display region and the non-display region to form a base substrate of the display panel, wherein the substrate material layer is made of a flexible material.

5. The method of claim 2, wherein the non-display region containing the peripheral circuits is formed by:
   forming a plurality of gate lines and a plurality of data lines in the display region of the base substrate, and simultaneously forming a plurality of signal leads or a plurality of driving circuits in the non-display region of the base substrate, wherein the plurality of gate lines and the plurality of data lines are vertically and horizontally crossed; and bonding a plurality of driving chips on the base substrate in the non-display region and respectively connected to the plurality of signal leads.

6. The method of claim 5, wherein forming the protective layer at least on the bending region further includes:
coating a protective layer on a surface of the plurality of driving circuits that is other than the plurality of driving chips.

7. The method of claim 2, wherein the non-display region containing the peripheral circuits is formed by:
forming a plurality of gate lines and a plurality of data lines in the display region of the base substrate, and a plurality of signal leads and a plurality of multi-level cascaded shift register units in the non-display region of the base substrate, wherein:
the plurality of gate lines and the plurality of data lines are vertically and horizontally crossed; and
the plurality of signal leads are connected to the multi-level cascaded shift register units.

8. The method of claim 7, wherein:
the plurality of multi-level cascaded shift register units form a plurality of gate driver on array (GOA) circuits.

9. The method of claim 1, wherein:
when bending the display panel at the bending region towards the back surface of the display panel, a bending angle is larger than or equal to 90°.

10. The method of claim 1, prior to folding the display panel at the bending region towards the back surface of the display panel, further including:
providing a back film on the back surface of the display panel.

* * * * *